United States Patent
Ito et al.

(10) Patent No.: US 8,008,168 B2
(45) Date of Patent: Aug. 30, 2011

(54) METHOD AND APPARATUS FOR MANUFACTURING SEMICONDUCTOR DEVICE

(75) Inventors: Hideki Ito, Numazu (JP); Naohisa Ikeya, Hiratsuka (JP)

(73) Assignee: NuFlare Technology, Inc., Shizuoka (JP)

( * ) Notice: Subject to any disclaimer, the term of this patent is extended or adjusted under 35 U.S.C. 154(b) by 0 days.

(21) Appl. No.: 12/729,926

(22) Filed: Mar. 23, 2010

(65) Prior Publication Data

US 2010/0240223 A1 Sep. 23, 2010

(30) Foreign Application Priority Data

Mar. 23, 2009 (JP) .................. 2009-070108

(51) Int. Cl.
*H01L 21/20* (2006.01)
*H01L 21/36* (2006.01)

(52) U.S. Cl. ........ 438/478; 118/715; 118/728; 118/730; 438/503; 438/507

(58) Field of Classification Search .................. 118/715, 118/728, 730; 438/478, 503, 507
See application file for complete search history.

(56) References Cited

U.S. PATENT DOCUMENTS

| | | | | |
|---|---|---|---|---|
| 3,721,210 A | * | 3/1973 | Helms et al. .................. 118/725 |
| 4,962,726 A | * | 10/1990 | Matsushita et al. ........... 118/719 |
| 5,273,588 A | * | 12/1993 | Foster et al. ............. 118/723 E |

FOREIGN PATENT DOCUMENTS

JP 2002-043302 2/2002

* cited by examiner

*Primary Examiner* — Asok Sarkar

(74) *Attorney, Agent, or Firm* — Finnegan, Henderson, Farabow, Garrett & Dunner, L.L.P.

(57) ABSTRACT

A method for manufacturing a semiconductor device, comprising: loading a wafer to be subjected to film formation to a chamber; supporting the wafer to be spaced from a film formation position of the wafer; preliminarily heating the wafer while rotating a rotating member for rotating the wafer through a supporting member during the film formation at a predetermined rotational speed under a state of the wafer to be spaced from the film formation position; placing the wafer on the supporting member in the film formation position; and heating the wafer at a predetermined temperature and supplying a process gas onto the wafer while rotating the wafer.

12 Claims, 3 Drawing Sheets

METHOD AND APPARATUS FOR MANUFACTURING SEMICONDUCTOR DEVICE

CROSS-REFERENCE TO RELATED APPLICATION

This application is based upon and claims the benefit of priority from the prior Japanese Patent Applications No. 2009-70108 filed on Mar. 23, 2009, the entire contents of which are incorporated herein by reference.

BACKGROUND OF THE INVENTION

The present invention relates to a method and an apparatus for manufacturing a semiconductor device used to form a film by supplying a reaction gas to a front surface of a semiconductor wafer while heating a rear face thereof, for example.

In recent years, with requirements of further price reduction and higher performance of semiconductor devices, improved quality such as improvement in the uniformity of a film thickness has been required in addition to high productivity in a film formation process of a wafer.

To meet such requirements, a technique using a single-wafer-processing type epitaxial film formation apparatus has been employed. According to the technique, a process gas is supplied onto a wafer while rotating the wafer at a high speed of over 900 rpm, for example, and the wafer is heated from a rear face thereof with a heater, thereby to form a film.

Such a rear-face heating system has a problem that during a process of loading a wafer under room temperature into a chamber preheated to approximately 700° C., for example, and transferring the wafer onto a member, a central temperature of the wafer drops, thus causing non-uniform temperature distribution. Accordingly, a technique for additionally heating a central member has been proposed as disclosed in Japanese Patent Application Laid-Open No. 2002-43302 (paragraphs [0028], [0029], etc.).

SUMMARY

According to an aspect of the present invention, there is provided a method for manufacturing a semiconductor device, comprising: loading a wafer to be subjected to film formation to a chamber; supporting the wafer to be spaced from a film formation position of the wafer; preliminarily heating the wafer while rotating a rotating member for rotating the wafer through a supporting member during the film formation at a predetermined rotational speed under a state of the wafer to be spaced from the film formation position; placing the wafer on the supporting member in the film formation position; and heating the wafer at a predetermined temperature and supplying a process gas onto the wafer while rotating the wafer.

According to an aspect of the present invention, an apparatus for manufacturing a semiconductor device, comprising: a chamber configured to load a wafer to be subjected to film formation; a gas supply mechanism configured to supply a process gas into the chamber; a gas discharge mechanism configured to discharge a gas from the chamber; a supporting member configured to be placed the wafer on the supporting member; a vertical drive mechanism configured to move up the wafer, to support the wafer at a lifted state and to move down the wafer; a heater configured to heat the wafer to a predetermined temperature; a temperature detection mechanism configured to detect temperature distribution of the wafer; and a rotation drive control mechanism having a rotating member, and configured to control a rotational speed of the rotating member based on the temperature distribution, the rotating member configured to rotate the wafer through the supporting member during the film formation and to rotate under a state of the wafer lifted.

DETAILED DESCRIPTION

Figure 1:
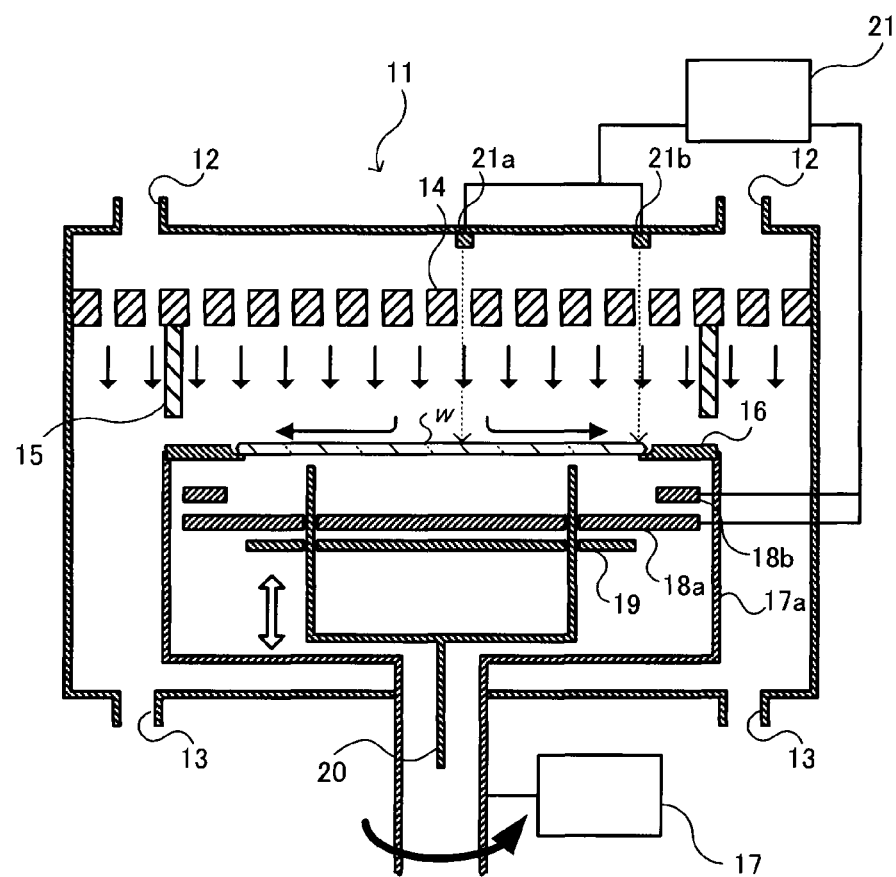
FIG. 1 is a sectional view of an apparatus for manufacturing a semiconductor device according to an aspect of the present invention.

Reference will now be made in detail to the present embodiment of the invention, an example of which is illustrated in the accompanying drawings. Wherever possible, the same reference numbers will be used throughout the drawing to refer to the same or like parts.

When a wafer under room temperature is loaded to a chamber conditioned to a high temperature, non-uniform temperature distribution may be prevented to some degree by heating a central portion of the wafer. However, in practice, it is difficult to control the temperature to such a degree that no temperature non-uniformity exists in the wafer. In particular, in a case where an oxide film is formed on a rear face of a wafer, the wafer is warped by not only a dead weight thereof but also a difference in temperature and/or coefficient of thermal expansion between the front face and the rear face of the wafer.

In addition, heating of the wafer may deform a concave state into a convex state; therefore, a bouncing phenomenon occurs on the wafer. Such a bouncing phenomenon displaces the wafer from a normal position and causes variations in a film thickness thereof, thus degrading reliability of a semiconductor device. Further, the wafer cannot beheld horizontally, resulting in dropping-off and/or fracture. This poses a problem of degradation in yield and productivity.

The inventors have verified that the bouncing phenomenon is more likely to occur when temperature variations between a central portion and a peripheral portion of a wafer become larger. That is to say, if the temperature at the central portion and the temperature at the peripheral portion of a wafer rise with the same variations after loading of the wafer to a chamber, the displacement thereof can be suppressed. The present invention has been accomplished based on such a finding.

Embodiments according to the present invention will be described below with reference to the accompanying drawings.

First Embodiment

FIG. 1 is a sectional view of an epitaxial growth apparatus that is an apparatus for manufacturing a semiconductor device according to the present embodiment. As illustrated in FIG. 1, on a top of a chamber 11 in which a wafer w of φ200 mm, for example, is subjected to film formation, there are provided gas supply openings 12 connected with a gas supply mechanism (not illustrated) for supplying a process gas or the like including a source gas, such as trichlorosilane or dichlorosilane onto the wafer w at a predetermined flow rate from above the chamber 11. On a bottom of the chamber 11, there are provided, for example, two gas discharge openings 13 connected with a gas discharge mechanism (not illustrated) for discharging a gas to control a pressure in the chamber 11 to be constant (normal pressure).

At an upper portion of the chamber 11, there are attached straightening vanes 14 for supplying a process gas supplied from the gas supply opening 12 onto the wafer w under a straightened state. A liner 15 of φ240 mm, for example, is connected to the straightening vane 14 so as to surround above the wafer w.

At a lower portion of the chamber 11, a supporting member 16 for placing the wafer w thereon is attached in a manner that a distance between the wafer w and the straightening vane 14 is approximately 70 mm, for example. Further, there is provided a rotation drive control mechanism 17 which rotates the wafer w and the supporting member 16 at a predetermined rotational speed, is connected with the supporting member 16 and which includes components such as a ring 17a serving as a rotating member, a motor (not illustrated) and a rotating shaft (not illustrated).

Below the supporting member 16, there is attached an in-heater 18a for heating a wafer w formed from SiC, for example. In addition, between the supporting member 16 and the in-heater 18a, there is attached an out-heater 18b for heating a peripheral edge portion of a wafer w formed from SiC, for example. Below the in-heater 18a, there is attached a disc-shaped reflector 19 for efficiently heating the wafer w. Further, there is provided a vertical drive mechanism which is arranged to penetrate through the in-heater 18a and the reflector 19, supports a wafer w loaded to the chamber 11 under a lifted state and which has an upthrust shaft 20 for moving down the wafer w onto the supporting member 16.

A temperature detection mechanism 21 having temperature sensors 21a and 21b for detecting temperature distribution of the wafer w, that is, temperatures of a central portion and a peripheral portion, respectively, is installed on an upperface inner wall of the chamber 11, for example. The temperature detection mechanism 21 is connected with the in-heater 18a and the out-heater 18b.

Using such an apparatus for manufacturing a semiconductor device, a Si epitaxial film is formed on a wafer w of φ200 mm, for example, formed with an oxide film of 900 nm, for example, on a rear face thereof.

First, a gate (not illustrated) of the chamber 11 is opened and a wafer w is loaded to the chamber 11 of which inside is preheated to 700° C., for example, using a robot hand or the like. At this time, the wafer w has no variations in temperature distribution and is slightly concaved by a dead weight thereof.

Figure 2:
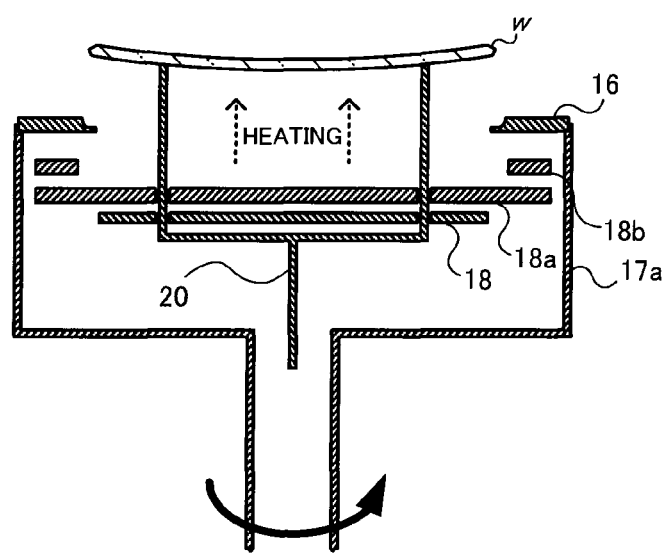
FIGS. 2, 5 and 6 each illustrate a manufacturing process of a semiconductor device according to an aspect of the present invention.

As illustrated in FIG. 2, the upthrust shaft 20 is moved up to place the wafer w onto the upthrust shaft 20 and the gate (not illustrated) is closed. Under this state, the wafer w is supported on the upthrust shaft 20 so that a height from a top face of the supporting member 16 is 60 mm, for example.

Under a state where the wafer w is supported at an interval from the supporting member, the in-heater 18a and the out-heater 18b are controlled for preliminary heating while a process gas excluding a source gas such as $H_2$ gas is being introduced into the chamber 11 from the gas supply mechanism (not illustrated) through the gas supply opening 12. At the same time, the rotation drive control mechanism 17 rotates the supporting member 16 at a rotational speed of 300 rpm, for example. That is to say, the supporting member 16 is rotated under a state where the wafer w is not placed.

Figure 3:
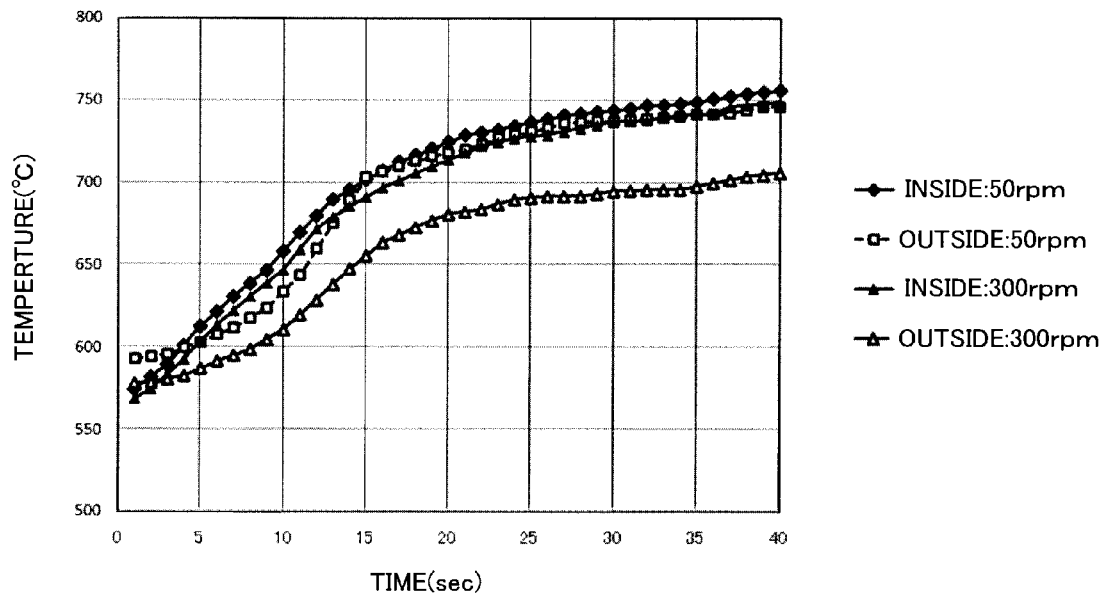
FIG. 3 is a graph of temperature changes in a wafer according to an aspect of the present invention.

FIG. 3 shows temperature changes depending upon wafer positions during preliminary heating at rotational speeds of the supporting member of 50 rpm and 300 rpm. As shown in FIG. 3, under a state where the wafer w is loaded to the chamber 11, an inner temperature (central portion) of the wafer w is lower than an outer temperature (peripheral portion).

When the rotational speed is 50 rpm, it becomes maximum difference between temperatures of inner and outer portions of the wafer w approximately 10 seconds after loading of the wafer to the chamber. After approximately 15 seconds after introduction, temperatures of the inner and outer portions of the wafer substantially become equal to each other. That is to say, the outer temperature rising speed, after having become lower than the inner temperature rising speed, conversely becomes higher. At this time, a bouncing phenomenon occurs on the wafer.

On the other hand, when the rotational speed is 300 rpm, it is found that outer temperature rising is suppressed. Outer temperature rising is suppressed immediately after loading of a wafer and the temperature rises under that state and therefore, no significant difference occurs between inner and outer temperature rising speeds. In this case, no bouncing phenomenon occurs on the wafer.

In this way, an outer temperature of the wafer w can be reduced by rotating the supporting member. It is considered that this may be caused by the fact that a discharge speed of the process gas discharged from between the liner 15 and the supporting member is increased by rotating the supporting member. In addition, it is found that an outer temperature rising speed of the wafer w can be controlled by a rotational speed. By controlling so that no difference occurs in variations between temperature rising speeds of inner and outer portions of the wafer w, that is, variations in the temperature distribution thereof, a bouncing phenomenon is suppressed from occurring on the wafer.

In this way, preliminary heating is implemented and, approximately 40 seconds after starting the heating, a central temperature of the wafer becomes approximately 750° C. and an ambient temperature becomes approximately 700° C., which keeps a stable state.

After the temperature has become stable, the upthrust shaft 20 is moved down to place the wafer w onto the supporting member 16. The in-heater 18a and the out-heater 18b are controlled so that an in-plane temperature of the wafer w detected by the temperature detection mechanism 21 is evenly 1100° C.

The rotation drive control mechanism 17 rotates the wafer w at a rotational speed of 900 rpm, for example, and the process gas is supplied onto the wafer w under a straightened state from the gas supply opening 12 through the straightening vanes 14. The process gas is prepared so that a trichlorosilane concentration is 2.5%, for example and is supplied at a flow rate of 50 SLM, for example.

On the other hand, process gas including surplus trichlorosilane, dilution gas and HCl which is a reaction by-product, is discharged downward from between the liner 15 and the supporting member 16. Further, such gases are discharged from the gas discharge opening 13 through the gas discharge mechanism (not illustrated), so that a pressure in the chamber 11 is controlled to be constant (normal pressure, for example). In this way, a Si epitaxial film is grown on the wafer w.

By rotating the supporting member 16 under a state where the wafer w is supported on the upthrust shaft 20 in this way, the temperature raise at an outer portion of the wafer w is suppressed, thereby to control the outer temperature rising speed. Thus, a bouncing phenomenon can be suppressed from occurring under a state where the wafer w is supported on the upthrust shaft 20. Accordingly, by moving down the upthrust shaft 20, the wafer w can be placed in an appropriate position on the supporting member 16, thereby to achieve uniform film formation on the wafer w. Further, degradation in yield and productivity is suppressed, thus providing a semiconductor device with higher reliability.

Second Embodiment

A configuration of an apparatus for manufacturing a semiconductor device according to the present embodiment is the same as that of the first embodiment except for that a temperature detection mechanism is connected with a rotation drive control mechanism.

Figure 4:
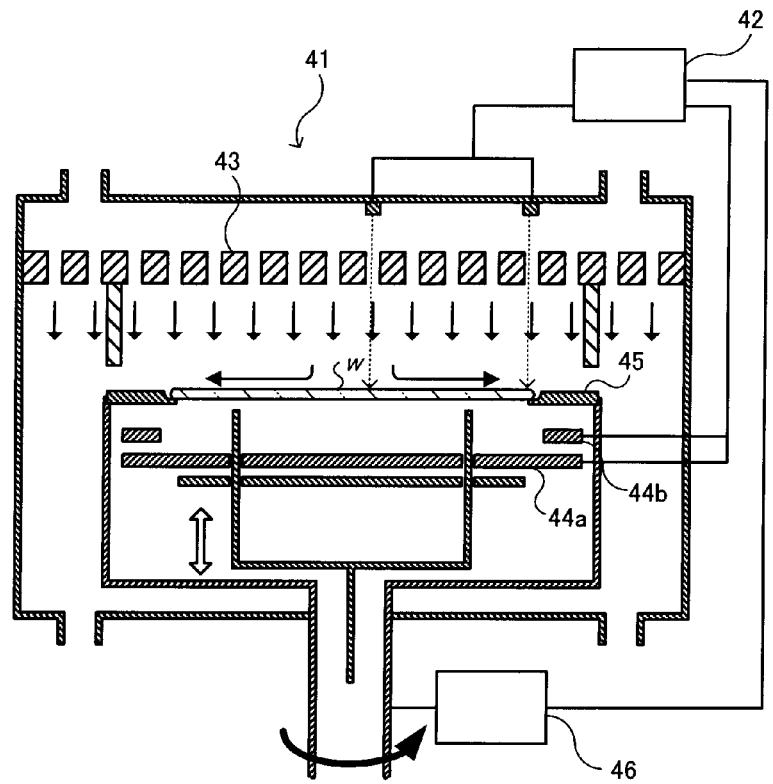
FIG. 4 is a sectional view of an apparatus for manufacturing a semiconductor device according to an aspect of the present invention.

That is to say, as illustrated in FIG. 4, a chamber 41 has a temperature detection mechanism 42 below the straightening vanes 43, for example. The temperature detection mechanism 42 is equipped with temperature sensors for detecting temperature distribution of the wafer w, that is, temperatures of a central portion and a peripheral portion thereof. In addition, the temperature detection mechanism 42 is connected with an in-heater 44a and an out-heater 44b in the same way as in the first embodiment. Further, the temperature detection mechanism 42 is connected with a rotation drive control mechanism 46 for rotating the wafer w and a supporting member 45 at a predetermined rotational speed.

Using such an apparatus for manufacturing a semiconductor device, the rotational speed of the supporting member 45 can be controlled based on temperature distribution of the wafer w. That is to say, using the rotation drive control mechanism 46, the rotational speed of the supporting member 45 can be changed so that a difference between temperatures of the inner and outer portions of the wafer w detected by the temperature detection mechanism 42 is 50° C., for example. Further, using the rotation drive control mechanism 46, the rotational speed of the supporting member 45 can be changed so that distribution of temperature variations of the wafer w, that is, inner and outer temperature variations (temperature rising speeds) are substantially equal to each other.

In this way, based on temperature distribution or temperature variation (temperature rising speeds) distribution of the wafer w, the rotational speed of the supporting member 45 is controlled to control an outer temperature rising speed of the wafer w more appropriately. Thus, in the same way as in the first embodiment, a bouncing phenomenon can be suppressed and the wafer w can be placed in an appropriate position on the supporting member 45, thereby to achieve uniform film formation on the wafer w. Further, degradation in yield and productivity is suppressed, thereby to provide higher reliability for a semiconductor device.

In these embodiments, preferably, the rotational speed of the supporting member is 50 to 300 rpm. If the rotational speed is less than 50 rpm, it can be considered that a temperature control effect by rotation of the supporting member is difficult to achieve. On the other hand, if the rotational speed exceeds 300 rpm, throughput may degrade because when the rotation of the supporting member is stopped to place a wafer w on the supporting member, the time required for the rotation stop prolongs by one second per 20 turns.

It is considered that a temperature or temperature rising speed of an outer portion of the wafer w, while the supporting member is being rotated, depends upon parameters such as a discharge speed of the process gas discharged from between the liner and the supporting member, a distance between the straightening vanes and the supporting member and a supporting height of the wafer w in addition to a rotational speed.

Hence, the rotational speed for obtaining a desired temperature or temperature rising speed changes according to respective parameters.

Figure 5:
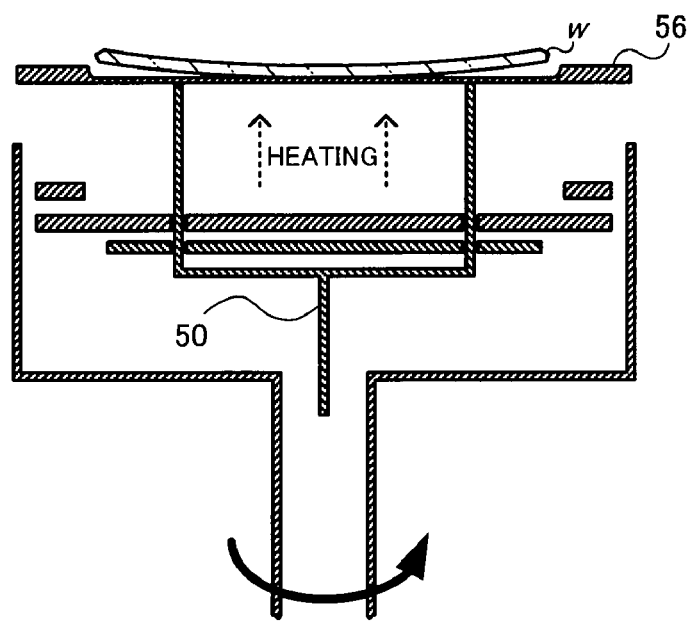
Figure 6:
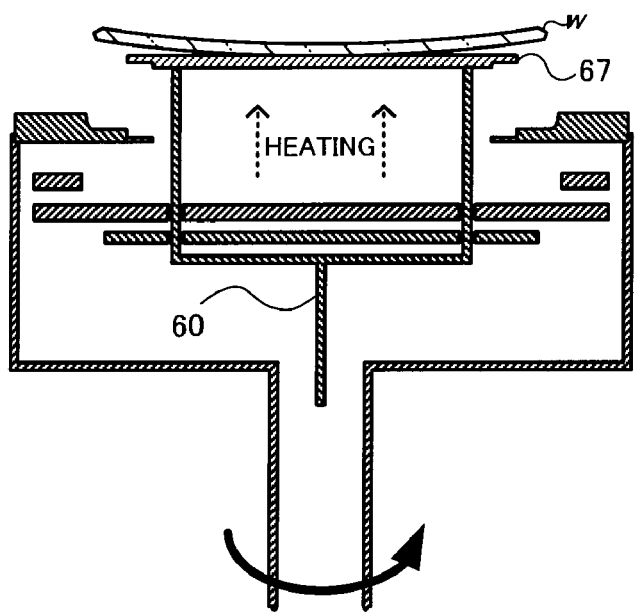

In these embodiments, a wafer w is placed directly on the upthrust shaft 20 in loading and preliminarily heating; however, the present invention is not limited thereto. For example, in an epitaxial growth apparatus having the same configuration as in FIG. 2, a wafer w may be placed on an upthrust shaft 50 through a supporting member 56 as illustrated in FIG. 5. Further, as illustrated in FIG. 6, a wafer w may be placed on an upthrust shaft 60 through a part 67 of one of components of a supporting member.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of an $SiO_2$ film and an $Si_3N_4$ film, and in the case of $SiO_2$ film, monosilane ($SiH_4$) and gases of $N_2$, $O_2$, and Ar are fed, and in the case of Si3N4 film, monosilane ($SiH_4$) and gases of $NH_3$, $N_2$, $O_2$, and Ar are fed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
   loading a wafer to be subjected to film formation to a chamber;
   supporting the wafer to be spaced from a film formation position of the wafer;
   preliminarily heating the wafer while rotating a rotating member for rotating the wafer during the film formation at a predetermined rotational speed under a state of the wafer to be spaced from the film formation position without rotating the wafer;
   placing the wafer on a supporting member in the film formation position; and
   heating the wafer at a predetermined temperature and supplying a process gas onto the wafer while rotating the wafer on the supporting member by the rotating member.

2. The method for manufacturing a semiconductor device according to claim 1, wherein the rotational speed is 50 to 300 rpm.

3. The method for manufacturing a semiconductor device according to claim 1, wherein temperature distribution of the wafer is detected during the preliminary heating.

4. The method for manufacturing a semiconductor device according to claim 3, wherein the rotational speed is controlled based on the temperature distribution of the wafer.

5. The method for manufacturing a semiconductor device according to claim 3, wherein distribution of temperature variations of the wafer is determined from the temperature distribution of the wafer.

6. The method for manufacturing a semiconductor device according to claim 5, wherein the rotational speed is controlled based on the distribution of temperature variations of the wafer.

7. The method for manufacturing a semiconductor device according to claim 1, wherein the wafer is placed under a state of the wafer to be spaced from the film formation position by retaining the wafer under a state of an upthrust shaft moved up.

8. The method for manufacturing a semiconductor device according to claim 7, wherein the wafer is placed on the supporting member of the film formation position by moving down the upthrust shaft.

9. The method for manufacturing a semiconductor device according to claim 7, wherein the wafer is placed directly on the upthrust shaft.

10. The method for manufacturing a semiconductor device according to claim 7, wherein the wafer is placed on the supporting member on the upthrust shaft.

11. The method for manufacturing a semiconductor device according to claim 7, wherein the wafer is placed on a part of the supporting member on the upthrust shaft.

12. The method for manufacturing a semiconductor device according to claim 1, wherein the wafer includes an oxide film on a rear face of the wafer.

* * * * *